(12) United States Patent
Gong et al.

(10) Patent No.: US 11,435,405 B2
(45) Date of Patent: Sep. 6, 2022

(54) ELECTRICAL ARCHITECTURE FOR ELECTROCHEMICAL IMPEDANCE SPECTROSCOPY

(71) Applicants: THE GOVERNING COUNCIL OF THE UNIVERSITY OF TORONTO, Toronto (CA); eLeapPower Ltd., North York (CA)

(72) Inventors: Zhe Gong, Toronto (CA); Olivier Trescases, Toronto (CA)

(73) Assignees: THE GOVERNING COUNCIL OF THE UNIVERSITY OF TORONTO, Toronto (CA); ELEAPPOWER LTD., North York (CA)

(*) Notice: Subject to any disclaimer, the term of this patent is extended or adjusted under 35 U.S.C. 154(b) by 18 days.

(21) Appl. No.: 16/630,601

(22) PCT Filed: Jul. 13, 2018

(86) PCT No.: PCT/CA2018/050858
§ 371 (c)(1),
(2) Date: Jan. 13, 2020

(87) PCT Pub. No.: WO2019/010585
PCT Pub. Date: Jan. 17, 2019

(65) Prior Publication Data
US 2021/0373081 A1    Dec. 2, 2021

Related U.S. Application Data

(60) Provisional application No. 62/532,172, filed on Jul. 13, 2017.

(51) Int. Cl.
*G01R 31/389* (2019.01)
*G01R 31/396* (2019.01)
(Continued)

(52) U.S. Cl.
CPC ......... *G01R 31/389* (2019.01); *G01R 31/396* (2019.01); *H01M 10/4257* (2013.01); *H01M 10/48* (2013.01); *H01M 2220/20* (2013.01)

(58) Field of Classification Search
None
See application file for complete search history.

(56) References Cited

U.S. PATENT DOCUMENTS

| 2015/0228990 A1 | 8/2015 | Ballantine et al. |
| 2016/0103186 A1 | 4/2016 | Hong et al. |

(Continued)

FOREIGN PATENT DOCUMENTS

| CN | 104 158 397 B | 6/2017 |
| EP | 2530480 A3 | 4/2017 |

(Continued)

OTHER PUBLICATIONS

Z. Gong, et al.; "IC for Online EIS in Automotive Batteries and Hybrid Architecture for High-Current Perturbation in Low-Impedance Cells"; IEEE Applied Power Electronics Conference and Exposition (APEC), San Antonio, TX; Apr. 19, 2018; pp. 1922-1929.

(Continued)

*Primary Examiner* — Jas A Sanghera
(74) *Attorney, Agent, or Firm* — Ware, Fressola, Maguire & Barber LLP (57) ABSTRACT

The present disclosure provides electrical architecture for electrochemical impedance spectroscopy (EIS). An EIS circuit comprises at least two current regulators and an electrical energy storage device, which are connected with one or more electrochemical cells in a configuration that decouples power flowing into the respective current regulators. The presence of the electrical energy storage device enables each regulator to operate simultaneously at lower (Continued)

power levels while inducing the desired EIS perturbation current. Operation at low power allows lower volume and cost for the same current compared to only dissipative or non-dissipative current regulators. Further, the electrical energy storage device allows the power flowing through the current regulators to be varied independently in order to achieve the desired EIS perturbation current while a minimum amount of heat is generated in the circuit, thus allowing the circuit to occupy minimal size and incur minimal cost.

31 Claims, 11 Drawing Sheets

(51) Int. Cl.
*H01M 10/42* (2006.01)
*H01M 10/48* (2006.01)

(56) References Cited

U.S. PATENT DOCUMENTS

| | | | |
|---|---|---|---|
| 2016/0336623 A1 | 11/2016 | Nayar et al. | |
| 2017/0160348 A1* | 6/2017 | Din | H02J 7/0014 |
| 2017/0163160 A1 | 6/2017 | Din et al. | |

FOREIGN PATENT DOCUMENTS

| | | | |
|---|---|---|---|
| JP | 2012044801 A | 3/2012 | |
| JP | 2012073256 A | 4/2012 | |
| JP | 2017512372 A | 5/2017 | |
| WO | 2016012922 A1 | 1/2016 | |
| WO | 2016/135893 A1 | 9/2016 | |

OTHER PUBLICATIONS

Huang Yimin; "Research on Hybrid Energy Storage Systems for Shipboard Power Systems"; Jan. 15, 2017; English Abstract.
Z. Gong, et al.; "EV BMS with Time-Shared Isolated Converters for Active Balancing and Auxiliary Bus Regulation"; 2018 IEEE Applied Power Electronics Conference and Exposition (APEC); Mar. 4, 2018; pp. 1922-1929.
English Abstract of JP 2017512372A.
English Abstract of JP2012044801A.
E. Din, C. Schaef, K. Moffat, and J. T. Stauth, "A Scalable Active Battery Management System With Embedded Real-Time Electrochemical Impedance Spectroscopy," IEEE Transactions on Power Electronics, Jul. 2017, vol. 32, No. 7, pp. 5688-5698.
J. A. A. Qahouq, "Online Battery Impedance Spectrum Measurement Method," in 2016 IEEE Applied Power Electronics Conference and Exposition (APEC), Mar. 2016, pp. 3611-3615.
Y. D. Lee, S. Y. Park, and S. B. Han, "Online Embedded impedance Measurement Using High-Power Battery Charger," IEEE Transactions on Industry Applications, Jan. 2015, vol. 51, No. 1, pp. 498-508.
Gamry Instruments, Inc., "Reference 3000 Potentistat/Galvanostat/ZRA Operator's Manual," Nov. 28, 2017.
Z. Gong et al., "IC For Online EIS in Automotive Batteries and Hybrid Architecture for High-Current Perturbation in Low-Impedance Cells," 2018 IEEE Applied Power Electronics Conference and Exposition (APEC), San Antonio, TX, 2018, pp. 1922-1929.
English translation of JP2012073256A.

* cited by examiner

ELECTRICAL ARCHITECTURE FOR ELECTROCHEMICAL IMPEDANCE SPECTROSCOPY

TECHNICAL FIELD

The present disclosure relates to an electrical architecture for performing electrochemical impedance spectroscopy (EIS), and in particular to an EIS circuit, a battery management system for electric vehicles, and systems and methods for performing EIS on one or more electrochemical cells.

BACKGROUND

Electrochemical impedance spectroscopy (EIS) generally involves the measurement of a battery's impedance at frequencies from DC to several kHz. EIS has typically been used for offline characterization with bench-top equipment, though some developments have been made in its application in real-time systems. Existing online EIS power architectures can in general be classified into two categories: dissipative and non-dissipative.

In the dissipative method, a current regulator such as a MOSFET operating in the linear region with feedback control is used and the perturbation energy is dissipated into the regulator itself. In cases where the required perturbation current is high, the dissipative method can become impractical due to the amount of heat that is generated in the system.

In the non-dissipative method, the perturbation current is induced without the intention to convert the energy into heat. In one example, a series of DC-DC converters is connected to a string of battery cells with the input and output of each converter attached to neighbouring cells, and the connection scheme spans the entire string. The perturbation current is induced by each DC-DC converter, flows from one cell to its neighbour, and can be bidirectional. In cases where the required perturbation current is high, the non-dissipative method suffers less from heating issues compared to the dissipative method. However, thermal management measures and component sizing are generally still required to increase, which in turn leads to volume increase. Another issue is that of magnetic saturation, which may cause the DC-DC converters to become impractically large for online use.

Meaningful voltage readings typically require large perturbation currents, resulting in the above-noted deficiencies of the existing online EIS power architectures. The magnitude of the current required for EIS is a function of the battery impedance and voltage measurement capability, and the battery impedance is highly sensitive to temperature. As an example to highlight what may be required of a power architecture for an EIS system, consider a 44 Ah lithium nickel manganese cobalt oxide pouch cell whose nominal ESR has been measured to be roughly 1 m$\Omega$. If one expects to obtain a meaningful voltage reading from a 10 mV peak-to-peak perturbation response, then the required perturbation current is 10 A peak-to-peak. In an example EV application where four such cells are connected in parallel to form one series unit, the required perturbation current would be 40 A peak-to-peak.

Accordingly, additional, alternative, and/or improved electrical architecture to enable EIS remains highly desirable.

SUMMARY

An electrochemical impedance spectroscopy (EIS) circuit for measuring impedance of one or more electrochemical cells is provided, comprising: an electrical energy storage device; a first current regulator connected between the electrical energy storage device and the one or more electrochemical cells; and a second current regulator. With this configuration, power flowing into the first and second current regulators is decoupled.

In an aspect of the EIS circuit the first current regulator is connected in series with the one or more electrochemical cells; the electrical energy storage device is connected in parallel with the series connection of the first current regulator and the one or more electrochemical cells; and the second current regulator is connected in parallel with the electrical energy storage device, and with the series connection of the first current regulator and the one or more electrochemical cells.

In an aspect of the EIS circuit, the first current regulator is connected in series with the electrical energy storage device; the series connection of the first current regulator and the electrical energy storage device is connected in parallel with the one or more electrochemical cells; and the second current regulator is connected in parallel with the series connection of the first current regulator and the electrical energy storage device, and with the one or more electrochemical cells.

In an aspect of the EIS circuit the first current regulator and the second current regulator are non-dissipative current regulators.

In an aspect of the EIS circuit the first current regulator and the second current regulator are dissipative current regulators.

In an aspect of the EIS circuit the first current regulator is a dissipative current regulator and the second current regulator is a non-dissipative current regulator.

In an aspect of the EIS circuit the first current regulator is a non-dissipative current regulator and the second current regulator is a dissipative current regulator.

In an aspect of the EIS circuit the non-dissipative current regulator is a switched-mode power converter having an output connected to a load.

In an aspect of the EIS circuit the switched-mode power converter has any isolated or non-isolated topology including dual active bridge, flyback, or non-inverting buck-boost.

In an aspect of the EIS circuit the switched-mode power converter supports bidirectional power flow.

In an aspect of the EIS circuit the load connected to the output of the switched-mode power converter is another electrochemical cell.

In an aspect of the EIS circuit the load connected to the output of the switched-mode power converter is one or more parallel-connected additional EIS circuits.

In an aspect of the EIS circuit the dissipative current regulator comprises a MOSFET with a current feedback control loop.

In an aspect of the EIS circuit the dissipative current regulator comprises a resistor in series with a control switch.

In an aspect of the EIS circuit one or both of the first current regulator and the second current regulator comprise a plurality of current regulators.

In an aspect of the EIS circuit the electrical energy storage device comprises at least one of a capacitor and an inductor.

In an aspect of the EIS circuit the electrical energy storage device comprises a plurality of electrical energy storage devices.

In an aspect of the EIS circuit the electrical energy storage device is connected in series with a control switch.

In an aspect of the EIS circuit the circuit further comprises one or more switches for connecting to the one or more electrochemical cells.

A battery management system (BMS) for an electric vehicle having one or more electrochemical cells is also provided. The BMS comprises the EIS circuit of the above aspects connected with the one or more electrochemical cells, and the BMS is configured to perform online electrochemical impedance spectroscopy of the one or more electrochemical cells.

In an aspect of the BMS at least one of the electrical energy storage device, the first current regulator, and the second current regulator are original components of the BMS.

In an aspect the BMS is configured to perform real-time impedance measurements of the one or more electrochemical cells during operation of the electric vehicle, wherein the measured impedance is used to determine one or more operating conditions including a state-of-charge, a temperature, and an age of the electrochemical cells.

A system for performing electrochemical impedance spectroscopy (EIS) on one or more electrochemical cells is also provided, comprising: the EIS circuit in accordance with any of the above aspects coupled with the one or more electrochemical cells; a current generation module configured to generate a respective current reference signal through the first and second current regulators to induce a desired EIS perturbation current in the EIS circuit; voltage measurement instrumentation configured to measure a voltage of the one or more electrochemical cells; and an impedance determination unit configured to determine an impedance of the one or more electrochemical cells based on the measured voltage and induced EIS perturbation current.

The system may further comprise a control unit configured to control the current generation module to generate the respective current reference signals to induce the desired EIS perturbation current.

The system may further comprise an evaluation unit configured to determine one or more operating conditions including a state-of-charge, a temperature, and an age of the electrochemical cells based on the determined impedance.

A method for performing electrochemical impedance spectroscopy (EIS) on one or more electrochemical cells is yet further provided using the EIS circuit of the aspects described above, the method comprising: generating a current reference signal for each of the first current regulator and the second current regulator respectively, the respective current reference signals generated to induce a desired perturbation current in the EIS circuit, the desired perturbation current comprising a sinusoidal perturbation current; inducing the respective current reference signals through each of the first and second current regulators to induce the desired EIS perturbation current in the EIS circuit; measuring a voltage of the one or more electrochemical cells, and determining an impedance of the one or more electrochemical cells based on the measured voltage and induced EIS perturbation current.

In the above-described method, the current reference signals for each of the first and second current regulators may be respectively generated.

The method may further comprise determining one or more operating conditions including a state-of-charge, a temperature, and an age of the electrochemical cells based on the determined impedance.

In an aspect of the method, the method further comprises discharging electrical energy from the electrical energy storage device prior to inducing the respective current reference signals through the first and second current regulators.

In an aspect of the method the sinusoidal perturbation current has a frequency range of 0 to 10 kHz.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

The present disclosure provides electrical architecture for electrochemical impedance spectroscopy (EIS). More particularly, an EIS circuit, a battery management system for an electric vehicle, and systems and methods for performing EIS on one or more electrochemical cells are provided. The EIS circuit comprises at least two current regulators and an electrical energy storage device that are connected with one or more electrochemical cells in a configuration that decouples power flowing into the respective current regulators. The current regulators may be either dissipative or non-dissipative current regulators. The presence of the electrical energy storage device enables each regulator to operate simultaneously at lower power levels while inducing the desired EIS perturbation current. Operation at low power allows lower volume and cost for the same current compared to only dissipative or non-dissipative current regulators. Further, the electrical energy storage device allows the power flowing through the current regulators to be varied independently in order to achieve the desired EIS perturbation current while a minimum amount of heat is generated in the circuit, thus allowing the circuit to occupy minimal size and incur minimal cost.

Accordingly, if a dissipative method or a dissipative current regulator is used in the EIS circuit an amount of heat generated in the system may be suppressed, and if a non-dissipative method or non-dissipative current regulator is used in the EIS circuit thermal management measures and component sizing may be reduced. Further, the sizing and costs of the current regulators may also be reduced. The EIS circuit may incorporate one or both of the dissipative method and the non-dissipative method.

The EIS circuit may be implemented to provide accurate determination of time-varying electrochemical cell equivalent circuit model parameter values. A sinusoidal perturbation current is induced in the electrochemical cells, in some cases with a DC offset, and the impedance may be calculated based on the known current and measured voltage phasors. Curve-fitting may be used to estimate circuit parameter values and a model can be produced for a wide range of operating conditions.

The EIS circuit disclosed herein may have several practical applications, including but not limited to being implemented as part of a battery management system (BMS) of electric vehicles (EVs) to enable online EIS. In order to increase the real-world driving range of EVs, while also reducing the cost, it is important to push the battery cell technology to the limits, while maintaining safety and longevity. Increasing the accuracy of estimation for the battery parameters, such as state-of-charge (SOC), power capability, and capacity, is key to eliminating the conservative limits that are commonly imposed in today's BMS. In an EV BMS with a DC-DC converter built-in for cell balancing or to supply the auxiliary load, the EIS architecture disclosed herein could be integrated with small incremental cost. Similarly, other native/original BMS components could be used as a component in the EIS circuit described herein, depending on the specific system setup. The calculated impedance from performing the EIS may be used to determine a wide range of operating conditions of the EV battery such as SOC, temperature, and age.

While the present disclosure may provide reference to integration into EV battery management systems to enable online or in-situ EIS, it is noted that the EIS circuits and methods for performing EIS disclosed herein are not limited to such and can be used for all EIS measurements.

The systems and methods in accordance with the present disclosure make use of the EIS circuit for performing electrical impedance spectroscopy on one or more electrochemical cells.

Embodiments are described below, by way of example only, with reference to FIGS. 1-11.

Figure 1A:
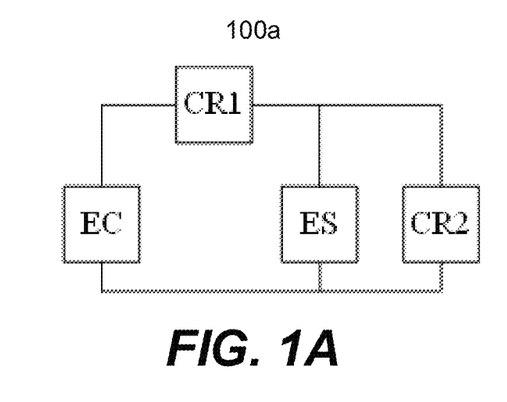
FIGS. 1A and 1B show a representation of an electrochemical impedance spectroscopy (EIS) circuit in accordance with embodiments of the present disclosure.
Figure 1B:
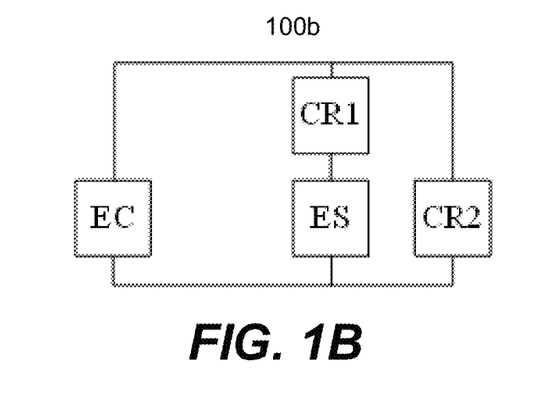
Figure 2A:
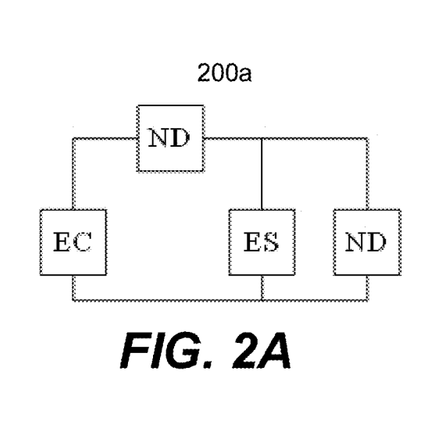
FIGS. 2A-2D show a representation of an electrochemical impedance spectroscopy (EIS) circuit in accordance with embodiments of the present disclosure.
Figure 2B:
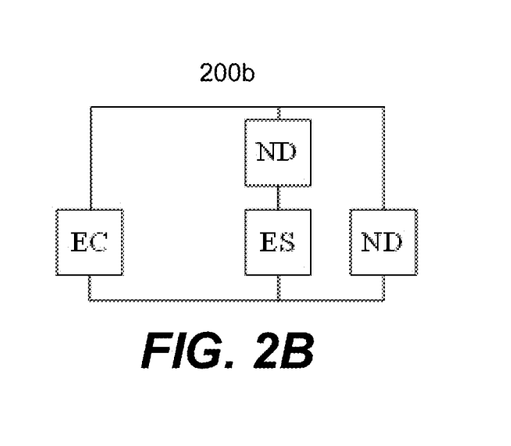
Figure 2C:
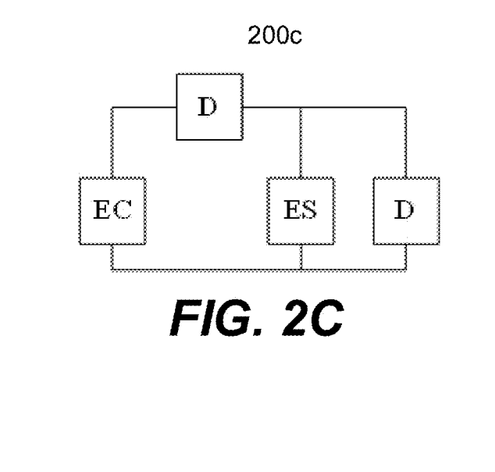
Figure 2D:
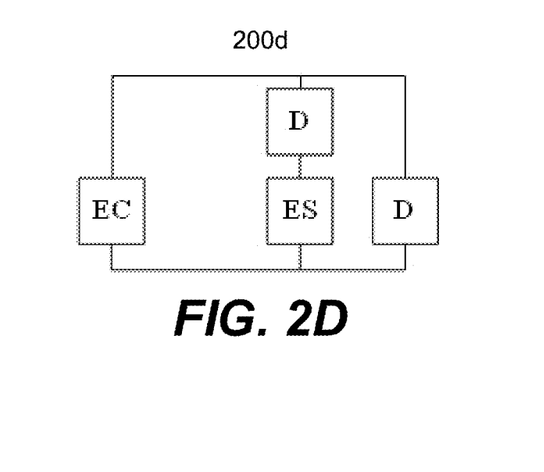

FIGS. 1A and 1B show a representation of an electrochemical impedance spectroscopy (EIS) circuit in accordance with embodiments of the present disclosure.

The EIS circuits 100a and 100b shown in FIGS. 1A and 1B comprise first and second current regulators CR1 and CR2, and electrical energy storage device ES, all of which are connected to/coupled with one or more electrochemical cells EC. The current regulators CR1 and CR2 and the electrical energy storage device ES are configured so that power flowing into the respective current regulators is decoupled from one another. The first current regulator CR1 is connected between the electrical energy storage device ES and the one or more electrochemical cells EC.

The current regulators CR1 and CR2 and the electrical energy storage device ES may be connected to/coupled with the one or more electrochemical cells EC through a matrix of one or more switches (not shown). Accordingly, the same EIS circuit components can perform EIS measurement on multiple different ECs, which can help to reduce the number of EIS circuits necessary to perform EIS measurement on multiple ECs, for example in an electric vehicle battery system. In some aspects, the EIS circuits may comprise more than the two current regulators CR1 and CR2. For example, each of the first and second current regulators CR1 and CR2 may comprise one or more current regulators (not shown). The electrical energy storage device may comprise a plurality of electrical energy storage devices. The EIS circuits may also comprise a single switch (not shown) provided in series with the electrical energy storage device ES to provide safety against over-voltage conditions.

In the EIS circuit 100a, a first current regulator CR1 is connected in series with the EC, and the ES and a second current regulator CR2 are respectively connected in parallel with CR1 and EC. In this configuration, the current passing through the first and second current regulators CR1 and CR2 are decoupled by the presence of the electrical energy storage device ES. Accordingly, the power flowing into the respective current regulators CR1 and CR2 is decoupled.

In the EIS circuit 100b, CR1 is connected in series with ES, and the EC and CR2 are respectively connected in parallel with CR1 and ES. In this configuration, the voltages of the first and second current regulators CR1 and CR2 are decoupled by the presence of the electrical energy storage device ES. Accordingly, the power flowing into the respective current regulators CR1 and CR2 is decoupled.

The energy storage device's capacity is typically 0.1% or less of the electrochemical cell under test, and its presence enables each regulator to operate simultaneously at lower power levels while inducing the desired EIS perturbation current. Each of the current regulators can be controlled independently to achieve the desired perturbation current as well as to minimize the amount of heat generated in the circuit. Operation at low power allows lower volume and cost for the same current compared to only dissipative or non-dissipative current regulators. In an EV BMS with a DC-DC converter built-in for cell balancing or to supply the auxiliary load, this architecture could be integrated with small incremental cost. Similarly, other native/original BMS components could be used as a component in the EIS circuit described herein, depending on the specific system setup.

FIGS. 2A-2D and 3A-3D show several possible configurations of the EIS circuits 100a and 100b using non-dissipative (ND) and/or dissipative (D) current regulators as the first and second current regulators CR1 and CR2 depicted in FIGS. 1A and 1B. Several implementations and components for EC, D, ES, and ND, as well as a wide range of applications for EIS exist, and would be readily appreciated by a person skilled in the art without deviating from the scope of this disclosure. The breadth of this possibility is highlighted through several examples of implementation alternatives in the remainder of this paragraph. For example, ND can be implemented as a switched-mode power converter for which many circuit topologies exist that support features such as bidirectional current operation/power flow, electrical isolation, regulation bandwidth capabilities, and so on. ND may have any isolated or non-isolated topology, for example, dual active bridge, flyback, non-inverting buck-boost, etc. D can be implemented as a MOSFET whose drain current is controlled by either a linear negative gate voltage feedback loop or PWM switching with some minimal current filtering. Alternatively, D can be implemented as a resistor in series with a switch, including semiconductor or contactor types, such as what is present in electric vehicles for passive cell balancing. As for EC, concerning lithium-ion batteries alone, cell chemistries, sizes, and parameter estimation algorithms exist for which the necessary characterisation frequency range can vary from 0 to 10 kHz. Finally, capacitors and inductors can both be used for electrical energy storage. Component alternative selection may be dependent on system constraints including volume, cost, thermal management, and complexity. Each combination of components can lead to a different combination of power division and coordination methodology. However, the selection of component alternatives does not depart from the scope of this disclosure.

FIGS. 2A-2D show a representation of an electrochemical impedance spectroscopy (EIS) circuit in accordance with embodiments of the present disclosure. The circuits 200a-d depict either non-dissipative or dissipative current regulators being used for the current regulators CR1 and CR2 in circuits 100a-b. In particular, the EIS circuit 200a shown in FIG. 2A corresponds to the EIS circuit 100a, where both of the current regulators are non-dissipative current regulators ND. The EIS circuit 200b shown in FIG. 2B corresponds to the EIS circuit 100b, where both of the current regulators are non-dissipative current regulators ND. The EIS circuit 200c shown in FIG. 2C corresponds to the EIS circuit 100a, where both of the current regulators are dissipative current regulators D. The EIS circuit 200d shown in FIG. 2D corresponds to the EIS circuit 100b, where both of the current regulators are dissipative current regulators D.

FIGS. 3A-3D show a representation of an electrochemical impedance spectroscopy (EIS) circuit in accordance with embodiments of the present disclosure. The circuits 300a-d depict a combination of non-dissipative and dissipative current regulators being used for the current regulators CR1 and CR2 in circuits 100a-b. In particular, the EIS circuit 300a shown in FIG. 3A corresponds to the EIS circuit 100a, where a first of the current regulators is dissipative D and the second current regulator is non-dissipative ND. The EIS circuit 300b shown in FIG. 3B corresponds to the EIS circuit 100b, where a first of the current regulators is dissipative D and the second current regulator is non-dissipative ND. The EIS circuit 300c shown in FIG. 3C corresponds to the EIS circuit 100a, where a first of the current regulators is non-dissipative ND and the second current regulator is dissipative D. The EIS circuit 300d shown in FIG. 3D corresponds to the EIS circuit 100b, where a first of the current regulators is non-dissipative ND and the second current regulator is dissipative D.

In some aspects, the output of ND may be connected to a load (not shown). The load connected to ND may be another EC, referred to for example as a load EC. In specific implementations for electric vehicles, the load EC may be any other EC in the vehicle, for example another EC in the primary energy storage system, or another EC located elsewhere in the vehicle. In other implementations, the load connected to the ND current regulator may be one or more parallel-connected EIS circuits as described above, and all of the EIS circuits may be controlled together to achieve net DC power at the point of parallel connection.

In the exemplary embodiment shown in FIG. 3A, the operating principle is as follows: current in regulator D is equal to the EIS perturbation current due to its serial placement with respect to EC. The current in the dissipative current regulator D may optionally be controlled in pulse-width modulation mode to achieve a specific current. The EIS current is required to have a DC offset such that it is always unidirectional. The DC offset is constrained by the limited voltage of the capacitor as the ES, which disallows application of a voltage higher than EC by ND (which is a switched-mode power converter for example), and thus limits D to only discharge the EC. In this case, the direction of current is away from EC, but it could also be toward EC with a different coordination method. As D regulates the EIS current, ES, which is a capacitor, stores charge and its voltage increases linearly with a sinusoidal ripple. The ES voltage may maintain some DC value during measurement to reduce the power dissipated in D. Meanwhile, ND draws a predetermined current that serves to maintain the ES voltage below a limiting value. The predetermined current can be sinusoidal to reduce the ripple voltage on ES. If ND is bidirectional, the sinusoidal ripple voltage on ES can be further reduced. The power lost in D is a function of the EC voltage, ES voltage, and the EIS current. The power transferred by ND can be selected based on the system requirements. The energy storage capacity of ES must be designed taking into account several factors: the EIS perturbation current, the desired measurement frequencies, the minimum measurement time, and the desired operating current of ND.

Figure 3A:
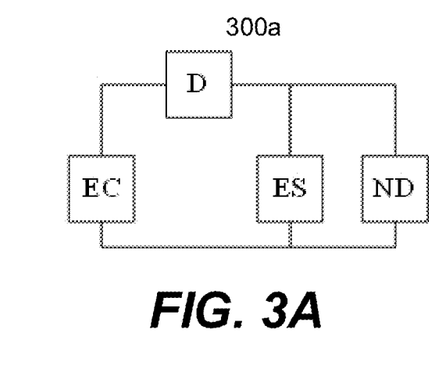
FIGS. 3A-3D show a representation of an electrochemical impedance spectroscopy (EIS) circuit in accordance with embodiments of the present disclosure.
Figure 3B:
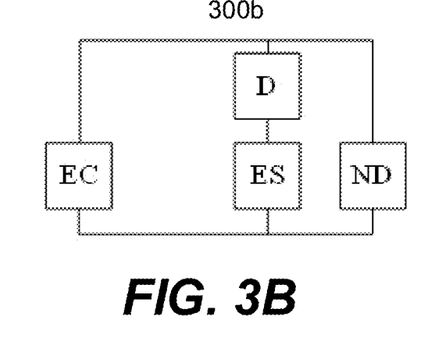
Figure 3C:
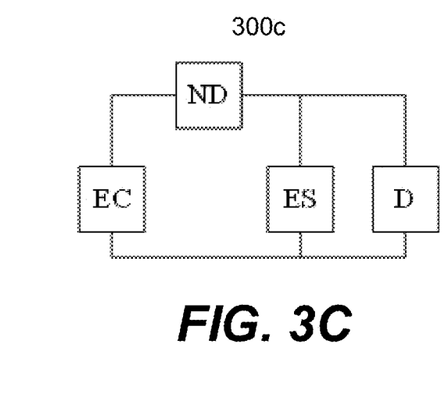
Figure 3D:
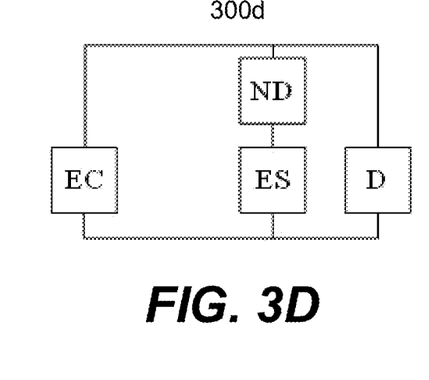
Figure 4:
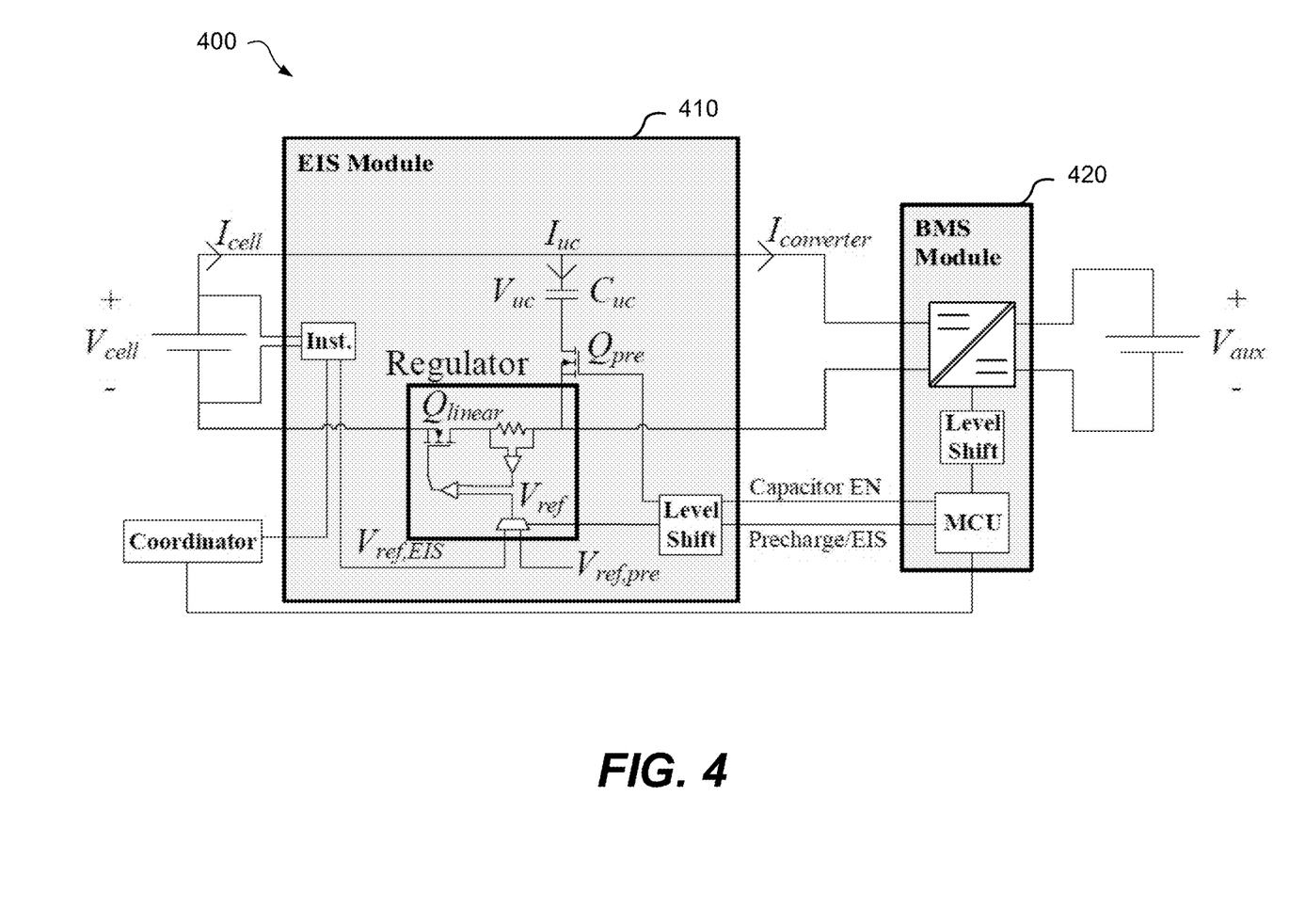
FIG. 4 shows an exemplary system diagram of the electrochemical impedance spectroscopy (EIS) circuit in accordance with the embodiment of FIG. 3A.

FIG. 4 shows an exemplary system diagram of the electrochemical impedance spectroscopy (EIS) circuit in accordance with the embodiment of FIG. 3A. In particular, the system diagram 400 may be implemented within a BMS system that targets EV application. The system 400 comprises an EIS module 410 and a BMS module 420.

With reference to the circuit components described with reference to FIGS. 1-3, the electrochemical cells EC consists of four parallel 44 Ah, 1 mΩ nominal ESR lithium nickel manganese cobalt oxide battery cells with voltage $V_{cell}$. The dissipative current regulator D is a $D^2PAK$ MOSFET with linear feedback current regulation that consists of $Q_{linear}$ and the other components inside the box labelled Regulator. This circuit is designed to match the amplified current sense voltage to $V_{ref}$, and the triangles represent voltage amplifiers, the resistor is a current sense resistor, and the trapezoid is an analog signal multiplexer. In the BMS, $Q_{linear}$ is normally used for cell charge equalisation, and its power transfer capability has not been modified. The electrical energy storage device ES is the ultracapacitor $C_{uc}$ with 50 F capacitance and control switch $Q_{pre}$, which is used to limit the voltage across $C_{uc}$ and enable proper coordination of the EIS functionality. The non-dissipative current regulator ND is the isolated DC-DC converter located in the BMS module, which is normally used for cell charge equalisation, and whose power transfer capability has not been modified. The converter uses the isolated Cuk topology that is duty cycle controlled by the microcontroller (MCU) with feedback originating from the input inductor current. The ND load in this case is a 12 V battery that can be the same as the EV auxiliary system battery. The block labelled Inst. contains the voltage measurement instrumentation and current reference signal generation required for impedance measurement, and should be implemented as a low cost, highly integrated solution. An external coordinator may be used to manage the system in EIS operation.

Figure 5:
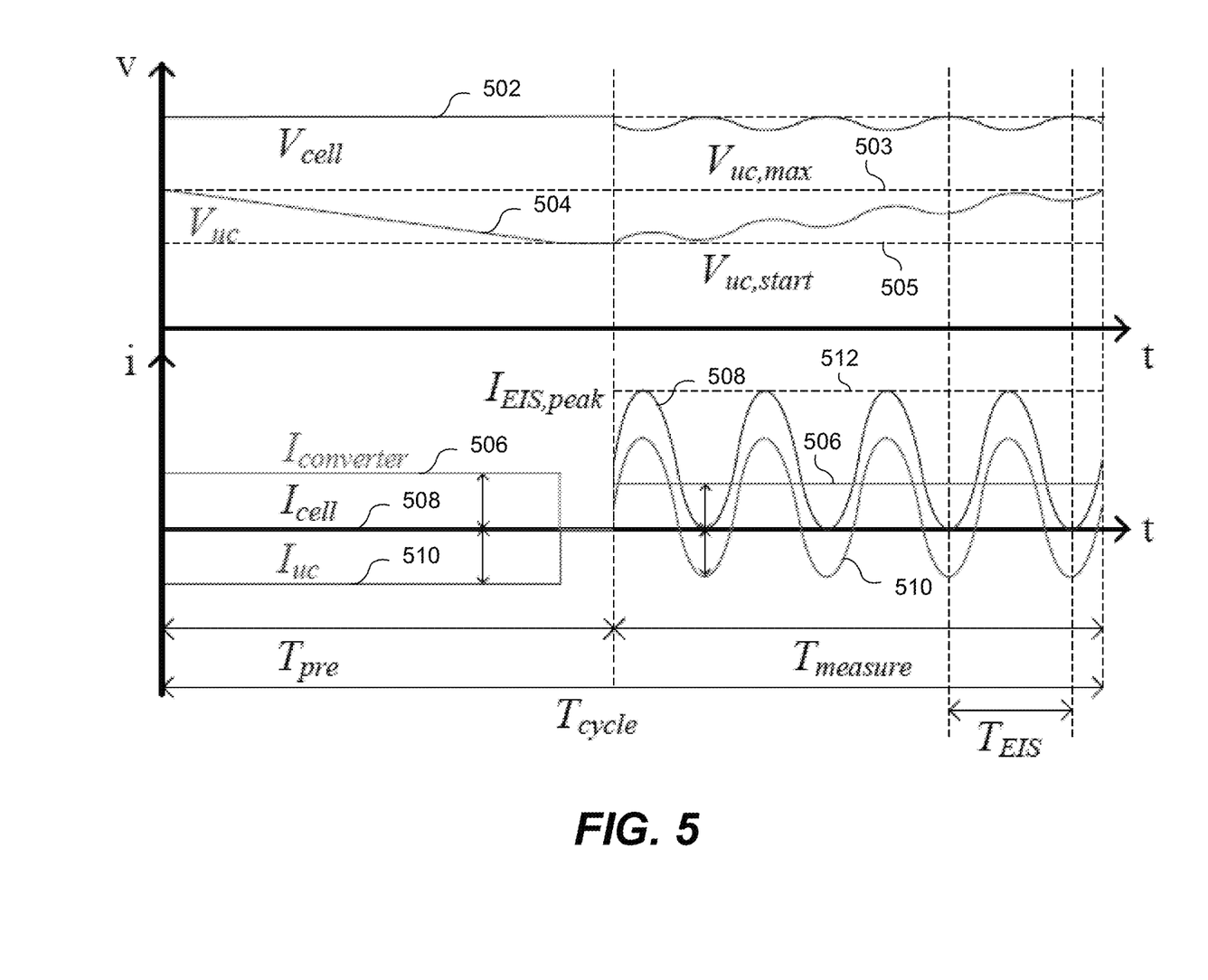
FIG. 5 shows an ideal steady-state operating waveform of the system shown in FIG. 4.

FIG. 5 shows an ideal steady-state operating waveform of the system shown in FIG. 4 during impedance measurement. In FIG. 5, $V_{cell}$ is indicated by line 502; $V_{uc}$ is indicated by line 504; $I_{converter}$ is indicated by line 506; $I_{cell}$ is indicated by line 508; and $I_{uc}$ is indicated by line 510. The peak current during the EIS measurement, $I_{EIS,peak}$, is indicated by line 512.

With reference to FIGS. 4 and 5, the order of operation is as follows: at system startup, $Q_{pre}$ is turned on and $Q_{linear}$ is controlled to follow $V_{ref,pre}$ in order to charge $C_{uc}$ to the desired start-of-measurement voltage, $V_{uc,start}$, provided by line 505. If the system is resuming measurement after finishing a previous cycle, $C_{uc}$ may instead require discharging toward $V_{uc,start}$ to account for the charge to be injected during the measurement. This is required to stay under the maximum voltage of the ultracapacitor, $V_{uc,max}$, indicated by line 503, over the course of the measurement. After the initial voltage preconditioning which takes place during $T_{pre}$, the system begins the impedance measurement by turning on $Q_{pre}$, changing $V_{ref}$ from $V_{ref,pre}$ to $V_{ref,EIS}$, and operating the DC-DC converter at a constant current. The measurement phase takes place during $T_{measure}$. In this implementation, the choice of constant as opposed to dynamically changing DC-DC converter current was made to eliminate EIS frequency ($1/T_{EIS}$) ripple current going to the auxiliary battery. The voltage preconditioning and measurement cycle is repeated until the EIS frequency range is covered, and uses a total time of $T_{cycle}$ to perform. In this embodiment, the frequency range is between 0.5 and 2000 Hz.

Figure 6:
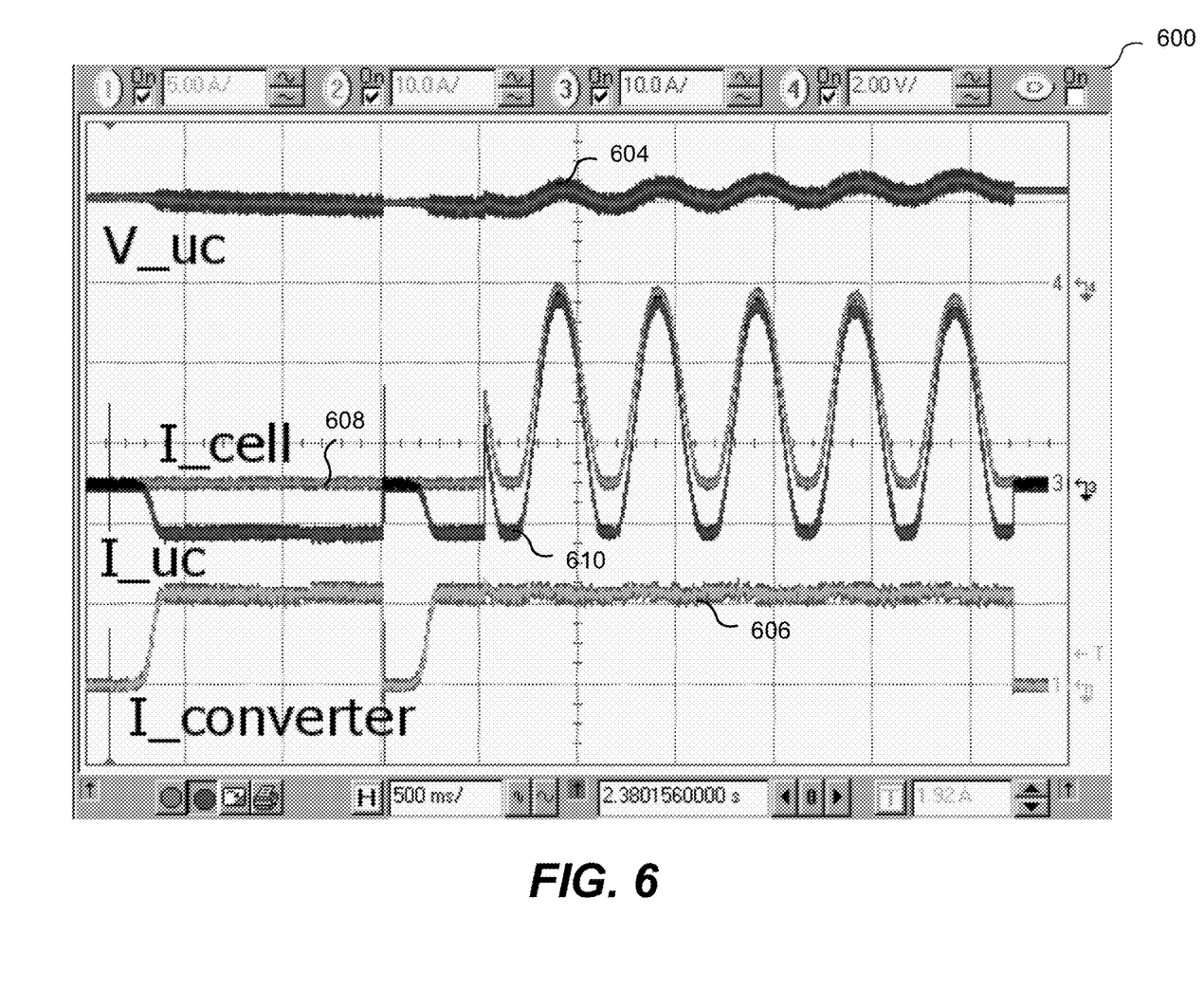
FIG. 6 shows an exemplary oscilloscope capture of the system shown in FIG. 4.

FIG. 6 shows an exemplary oscilloscope capture 600 of the system shown in FIG. 4. In FIG. 6, $V_{uc}$ is indicated by line 604; $I_{converter}$ is indicated by line 606; $I_{cell}$ is indicated by line 608; and $I_{uc}$ is indicated by line 610.

Figure 7:
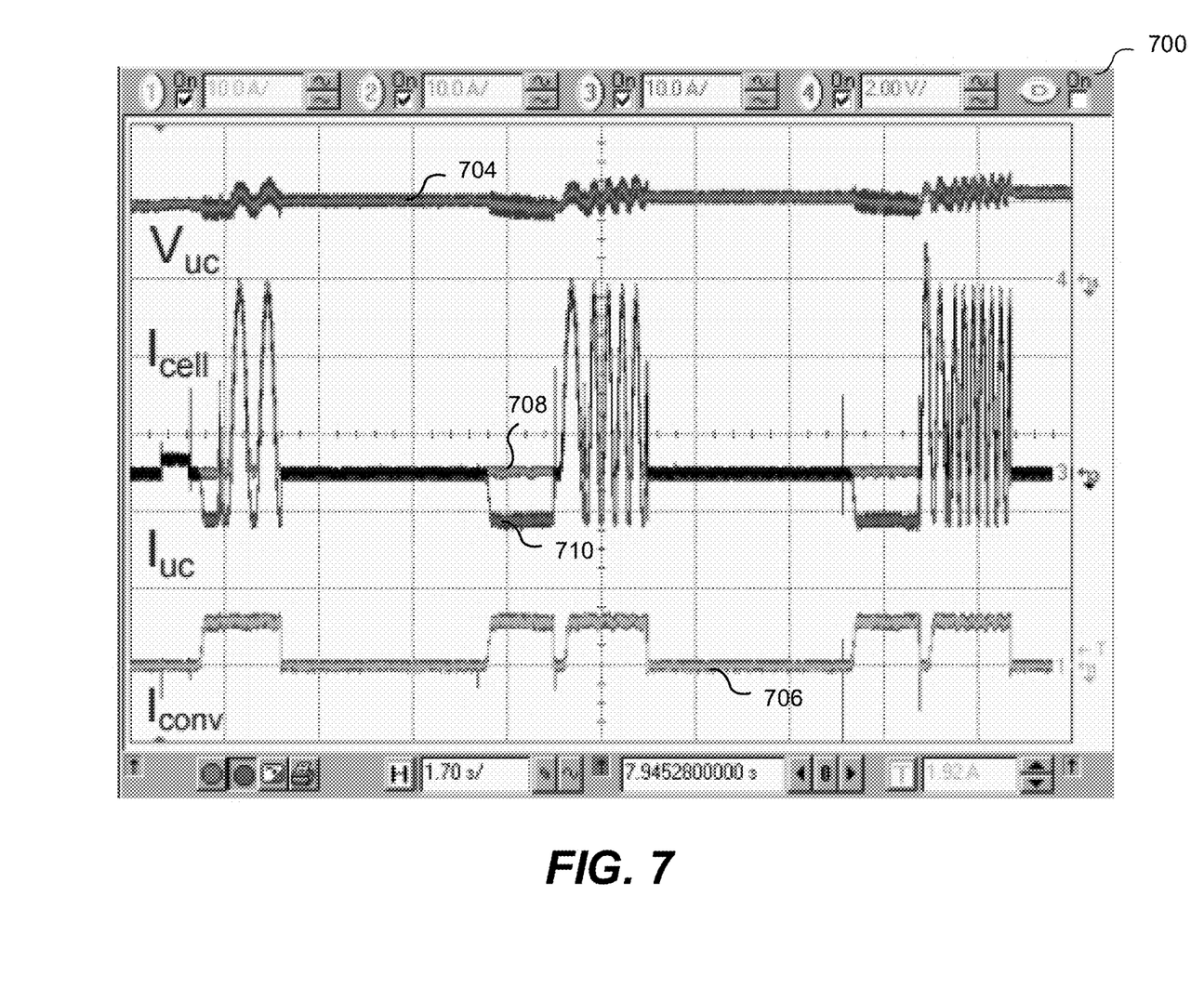
FIG. 7 shows an exemplary oscilloscope capture of the system shown in FIG. 4 over repeated EIS measurements.

FIG. 7 shows an exemplary oscilloscope capture 700 of the system shown in FIG. 4 over repeated EIS measurements. In FIG. 7, $V_{uc}$ is indicated by line 704; $I_{converter}$ is indicated by line 706; $I_{cell}$ is indicated by line 708; and $I_{uc}$ is indicated by line 710.

Figure 8:
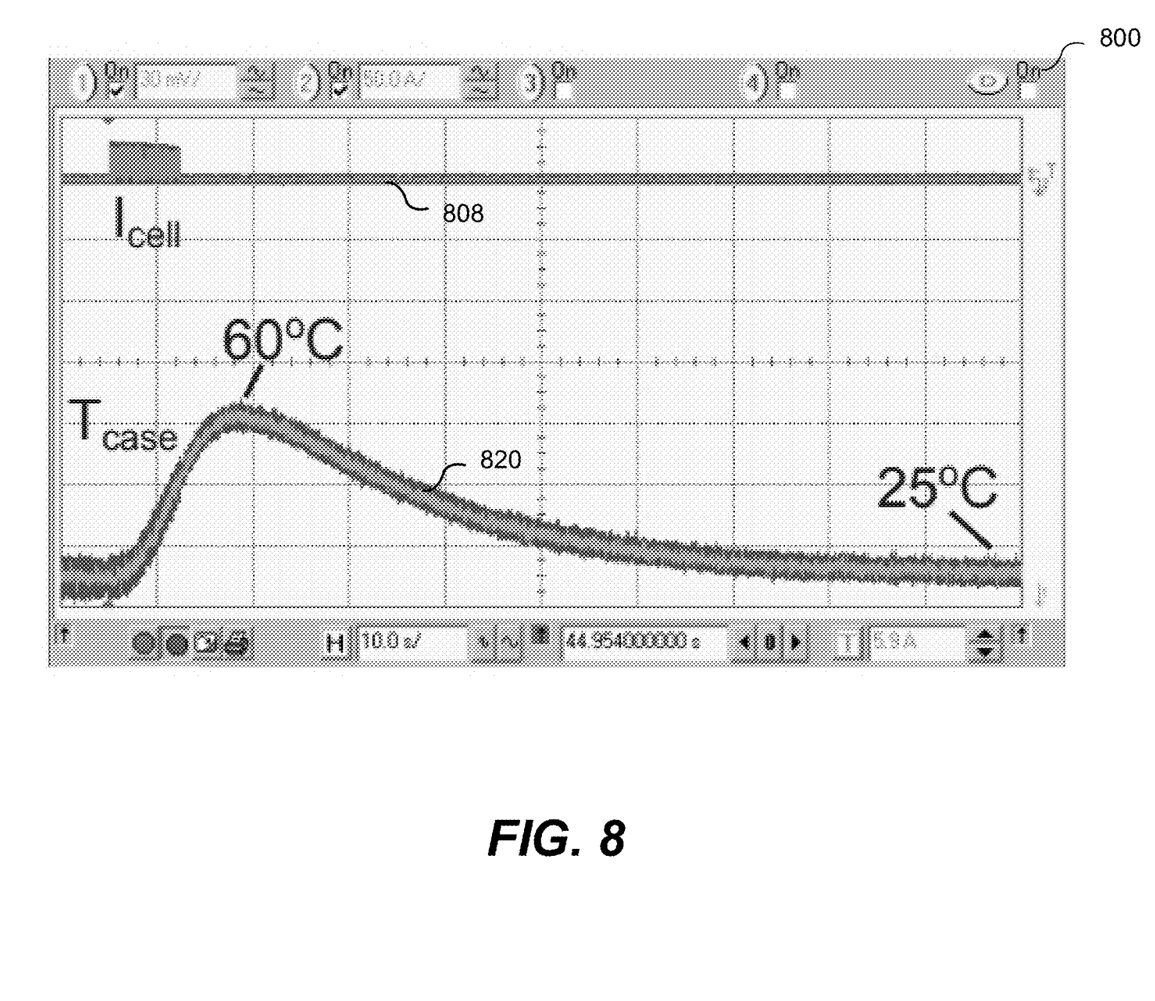
FIG. 8 shows an exemplary oscilloscope capture of $T_{case}$, the case temperature of $Q_{linear}$, over one impedance measurement cycle of the system shown in FIG. 4.

FIG. 8 shows an exemplary oscilloscope capture 800 of $T_{case}$ (line 820), the case temperature of ainear, over one impedance measurement cycle of the system shown in FIG. 4. The system is operating at peak $I_{cell}$ (line 808) of 30 A and $T_{measure}$ of 9 s. The peak temperature of 60 degrees Celsius indicates that the system shown in FIG. 4 is successful in reducing the heat generated in linear, since without the DC voltage contributed by $C_{uc}$, $Q_{linear}$ would experience more than double the amount of heat generation, and its case temperature would exceed the maximum operational temperature.

Figure 9:
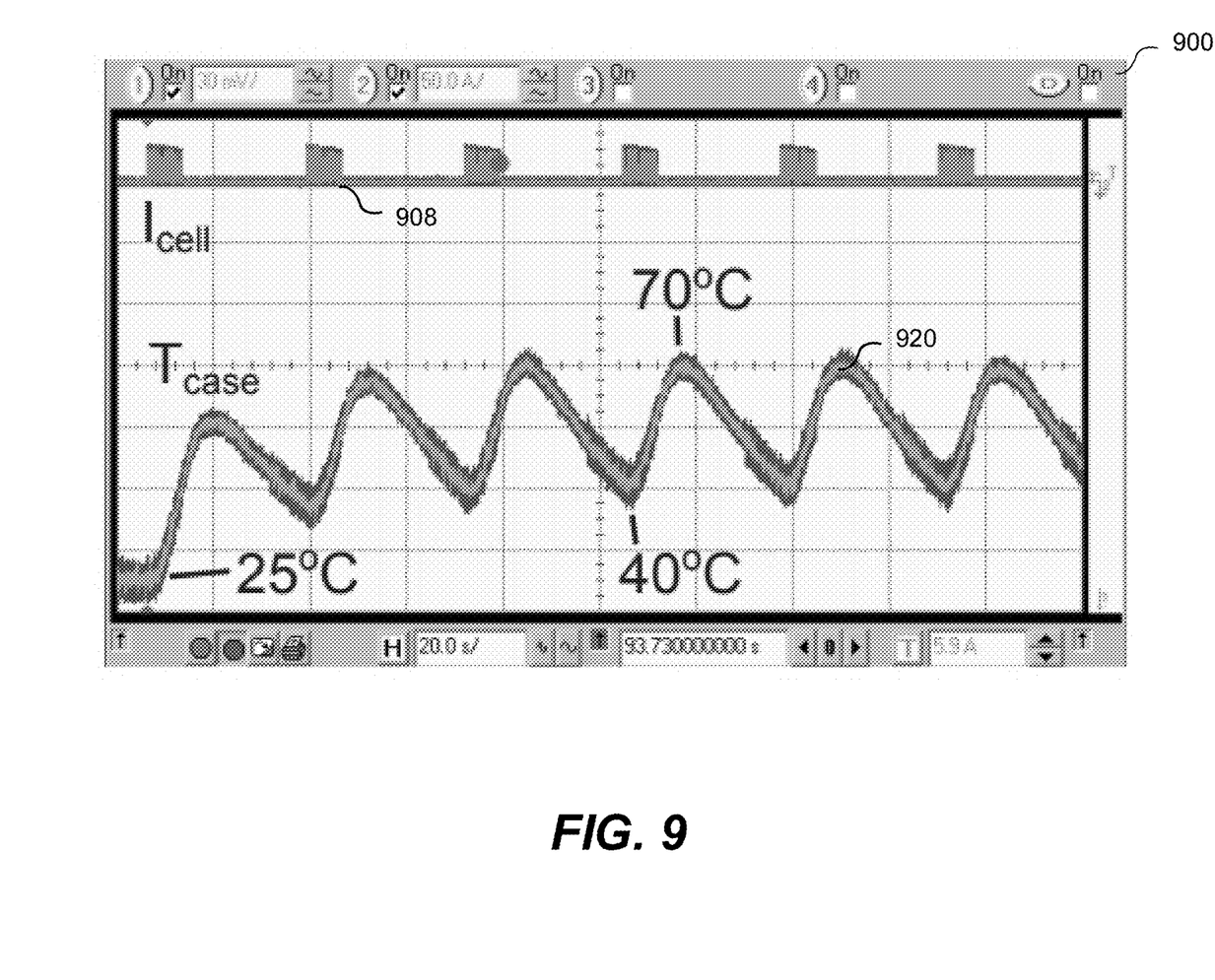
FIG. 9 shows an exemplary oscilloscope capture of $T_{case}$, the case temperature of $Q_{linear}$, over six impedance measurement cycles of the system shown in FIG. 4.

FIG. 9 shows an exemplary oscilloscope capture 900 of $T_{case}$ (line 920), the case temperature of $Q_{linear}$, over six impedance measurement cycles of the system shown in FIG. 4. The system is operating at peak $I_{cell}$ (line 908) of 30 A and $T_{measure}$ of 9 s. The steady-state peak temperature of 70 degrees Celsius indicates that the system shown in FIG. 4 is successful in reducing the heat generated in $Q_{linear}$, since without the DC voltage contributed by $C_{uc}$, $Q_{linear}$ would experience more than double the amount of heat generation, and its case temperature would exceed the maximum operational temperature.

Figure 10:
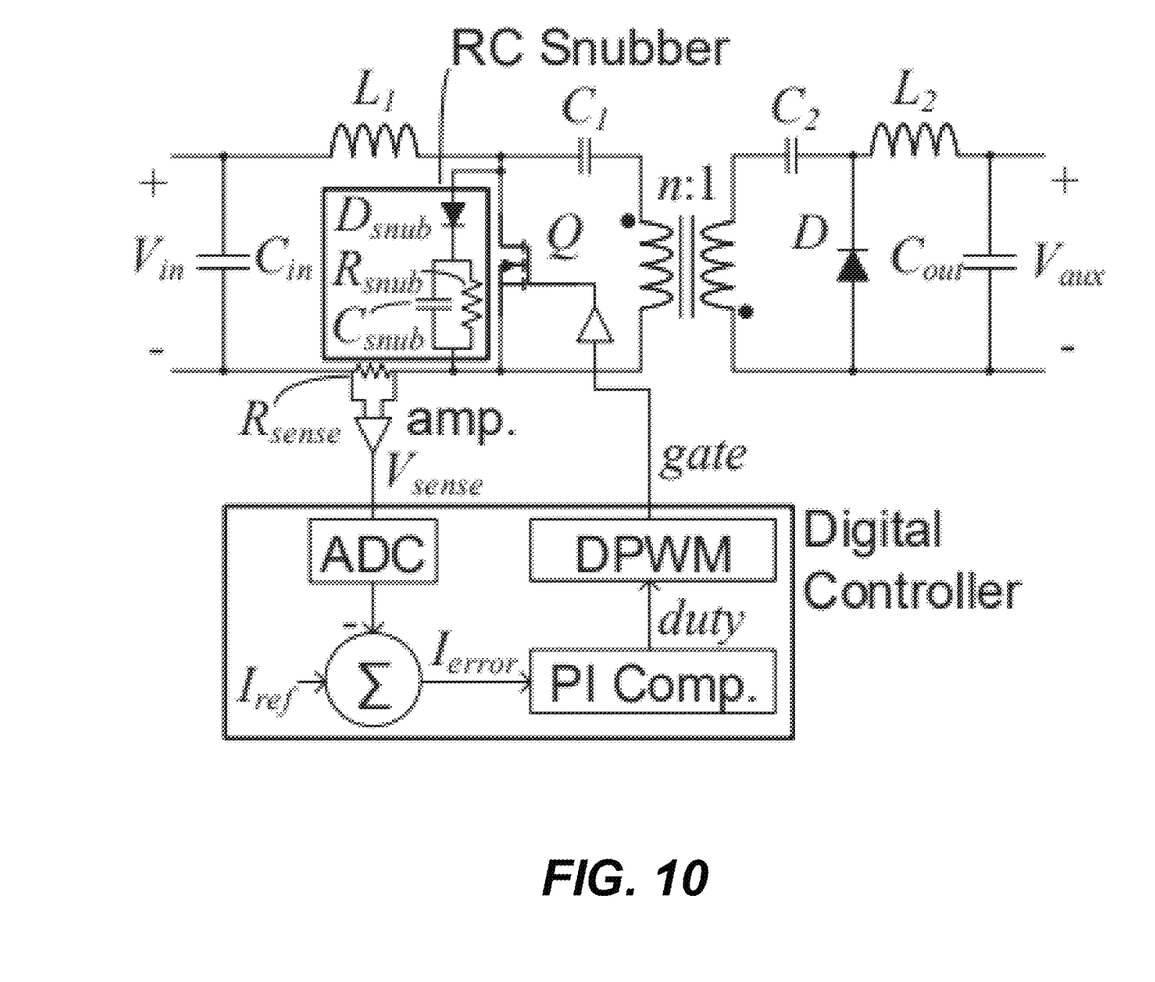
FIG. 10 shows an implementation of the switched-mode power converter used in the system shown in FIG. 4 according to some embodiments.

FIG. 10 shows an implementation of the switched-mode power converter used in the system shown in FIG. 4 according to some embodiments. In this specific implementation shown in FIG. 10, the converter has isolated Cuk topology whose input-side current is digitally-controlled.

Figure 11:
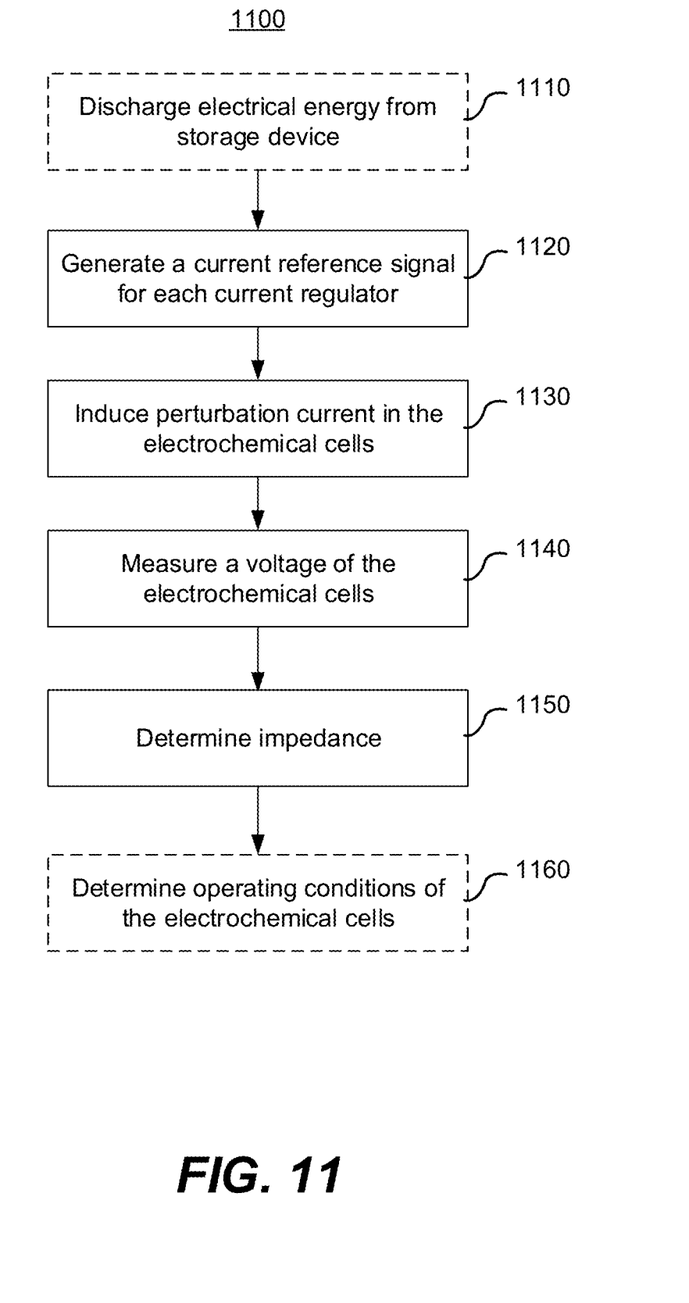
FIG. 11 shows a method for performing electrochemical impedance spectroscopy.

FIG. 11 shows a method 1100 for performing electrochemical impedance spectroscopy (EIS). The method 1100 may be performed using the EIS circuit as described herein. The method may also be implemented by a system designed to perform EIS on one or more electrochemical cells. The system may comprise the EIS circuit described herein, a current generation module configured to generate a respective current reference signal through the first and second current regulators, voltage measurement instrumentation configured to measure a voltage of the electrochemical cells, and an impedance determination unit configured to determine an impedance of the electrochemical cells based on the measured voltage. The system may further comprise a control unit configured to control the current generation module, and/or an evaluation unit configured to determine one or more operating conditions of the electrochemical cells based on the determined impedance. These system components may be implemented using one or more hardware components. For example, in FIG. 4 the block labelled Inst. contains the voltage measurement instrumentation and current reference signal generation required for impedance measurement. The current generation module and the voltage measurement instrumentation of the system may be consolidated as part of an instrumentation module. The impedance determination unit, the control unit, and the evaluation unit may be provided as one or more processing devices. Instructions may be stored in a memory coupled with the processing device(s) for determining the impedance, controlling the current reference signals, and determining operating conditions. The method 1100 may be stored as computer-readable instructions stored on a non-transitory memory that can be executed by a computing device such as a processor to control the system/EIS architecture. The method may be performed online and the impedance may be measured in real-time.

The method 1100 comprises generating a current reference signal for each of the first and second current regulators (1120). The current reference signals are individually controllable/generated so as to induce a desired perturbation current in the EIS circuit. The current reference signals are induced through each of the first and second current regulators to induce the desired perturbation current in the electrochemical cell (1130). A voltage of the one or more electrochemical cells is measured (1140). Based on the measured voltage and the induced EIS perturbation current, the impedance of the electrochemical cells can be determined (1150). Further, operating conditions of the electrochemical cells can be determined, such as state-of-charge, temperature, age, etc. In the method 1100, prior to generating and/or inducing the current reference signals, electrical energy may be discharged from the electrical energy storage device (1110).

It would be appreciated by one of ordinary skill in the art that the system and components shown in FIGS. 1-11 may include components not shown in the drawings. For simplicity and clarity of the illustration, elements in the figures are not necessarily to scale, are only schematic and are non-limiting of the elements structures. It will be apparent to persons skilled in the art that a number of variations and modifications can be made without departing from the scope of the invention as defined in the claims.

What is claimed is:

1. An electrochemical impedance spectroscopy (EIS) circuit for measuring impedance of one or more electrochemical cells, comprising:
   an electrical energy storage device;
   a first current regulator connected between the electrical energy storage device and the one or more electrochemical cells; and
   a second current regulator, wherein power flowing into the first current regulator and the second current regulator is decoupled.

2. The EIS circuit of claim 1, wherein:
   the first current regulator is connected in series with the one or more electrochemical cells forming a series connection;

the electrical energy storage device is connected in parallel with the series connection of the first current regulator and the one or more electrochemical cells; and the second current regulator is connected in parallel with the electrical energy storage device, and with the series connection of the first current regulator and the one or more electrochemical cells.

3. The EIS circuit of claim 1, wherein:

the first current regulator is connected in series with the electrical energy storage device forming a series connection;

the series connection of the first current regulator and the electrical energy storage device is connected in parallel with the one or more electrochemical cells; and the second current regulator is connected in parallel with the series connection of the first current regulator and the electrical energy storage device, and with the one or more electrochemical cells.

4. The EIS circuit of claim 1, wherein the first current regulator and the second current regulator are non-dissipative current regulators.

5. The EIS circuit of claim 4, wherein the non-dissipative current regulators include a switched-mode power converter having an output connected to a load.

6. The EIS circuit of claim 5, wherein the switched-mode power converter has an isolated or non-isolated topology.

7. The method of claim 6, wherein the switch-mode power converter has a dual active bridge, flyback, or non-inverting buck-boost topology.

8. The EIS circuit of claim 5, wherein the switched-mode power converter supports bidirectional power flow.

9. The EIS circuit of claim 5, wherein the load connected to the output of the switched-mode power converter is another electrochemical cell.

10. The EIS circuit of claim 5, wherein the load connected to the output of the switched-mode power converter is one or more parallel-connected additional EIS circuits.

11. The EIS circuit of claim 1, wherein the first current regulator and the second current regulator are dissipative current regulators.

12. The EIS circuit of claim 11, wherein the dissipative current regulators comprises a MOSFET with a current feedback control loop.

13. The EIS circuit of claim 11, wherein the dissipative current regulators comprises a resistor in series with a control switch.

14. The EIS circuit of claim 1, wherein the first current regulator is a dissipative current regulator and the second current regulator is a non-dissipative current regulator.

15. The EIS circuit of claim 1, wherein the first current regulator is a non-dissipative current regulator and the second current regulator is a dissipative current regulator.

16. The EIS circuit of claim 1, wherein one or both of the first current regulator and the second current regulator comprise a plurality of current regulators.

17. The EIS circuit of claim 1, wherein the electrical energy storage device comprises at least one of a capacitor and an inductor.

18. The EIS circuit of claim 1, wherein the electrical energy storage device comprises a plurality of electrical energy storage devices.

19. The EIS circuit of claim 1, wherein the electrical energy storage device is connected in series with a control switch.

20. The EIS circuit of claim 1, the EIS circuit further comprising one or more switches for connecting to the one or more electrochemical cells.

21. A battery management system (BMS) for an electric vehicle having one or more electrochemical cells, the BMS comprising the EIS circuit of claim 1, connected with the one or more electrochemical cells, and wherein the BMS is configured to perform online electrochemical impedance spectroscopy of the one or more electrochemical cells.

22. The BMS of claim 21, wherein at least one of the electrical energy storage device, the first current regulator, and the second current regulator are original components of the BMS.

23. The BMS of claim 21, configured to perform real-time impedance measurements of the one or more electrochemical cells during operation of the electric vehicle, wherein the measured impedance is used to determine one or more operating conditions including a state-of-charge, a temperature, and an age of the electrochemical cells.

24. A system for performing electrochemical impedance spectroscopy (EIS) on one or more electrochemical cells, comprising:

the EIS circuit of claim 1 coupled with the one or more electrochemical cells;

a current generation module configured to generate a respective current reference signal through the first current regulator and the second current regulator to induce a desired EIS perturbation current in the EIS circuit;

voltage measurement instrumentation configured to measure a voltage of the one or more electrochemical cells; and an impedance determination unit configured to determine an impedance of the one or more electrochemical cells based on the voltage measured and induced EIS perturbation current.

25. The system of claim 24, the system further comprising a control unit configured to control the current generation module to generate respective current reference signals to induce the desired EIS perturbation current.

26. The system of claim 24, the system further comprising an evaluation unit configured to determine one or more operating conditions including a state-of-charge, a temperature, and an age of the electrochemical cells based on the impedance determined.

27. A method for performing electrochemical impedance spectroscopy (EIS) on one or more electrochemical cells using the EIS circuit of claim 1, comprising:

generating a respective current reference signal for each of the first current regulator and the second current regulator respectively to induce a desired perturbation current in the EIS circuit, the desired perturbation current comprising a sinusoidal perturbation current;

inducing each respective current reference signal through each of the first current regulator and the second current regulator to induce the desired perturbation current in the EIS circuit;

measuring a voltage of the one or more electrochemical cells, and determining an impedance of the one or more electrochemical cells based on the voltage measured and the desired perturbation current induced.

28. The method of claim 27, wherein the respective current reference signal for each of the first current regulator and second current regulator are respectively generated.

29. The method of claim 27, the method further comprising determining one or more operating conditions including a state-of-charge, a temperature, and an age of the electrochemical cells based on the determined impedance determined.

30. The method of claim 27, the method further comprising, discharging electrical energy from the electrical energy storage device prior to inducing the respective current reference signal through the first current regulator and the second current regulator.

31. The method of claim 27, wherein the sinusoidal perturbation current has a frequency range of 0 to 10 kHz.

* * * * *